United States Patent
Ma et al.

(10) Patent No.: US 7,830,192 B2
(45) Date of Patent: Nov. 9, 2010

(54) DELAY CIRCUIT AND RELATED METHOD THEREOF

(75) Inventors: Chang-Po Ma, Hsinchu (TW);
Yuan-Chin Liu, Hsinchu (TW)

(73) Assignee: Mediatek, Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/553,963

(22) Filed: Sep. 3, 2009

(65) Prior Publication Data

US 2009/0322397 A1    Dec. 31, 2009

Related U.S. Application Data

(63) Continuation of application No. 11/763,454, filed on Jun. 15, 2007, now abandoned.

(51) Int. Cl.
*H03H 11/26* (2006.01)

(52) U.S. Cl. .................. 327/276; 327/277; 327/299

(58) Field of Classification Search ......... 327/276–279, 327/284–286, 299
See application file for complete search history.

(56) References Cited

U.S. PATENT DOCUMENTS

| | | | |
|---|---|---|---|
| 5,734,283 | A | 3/1998 | Hedberg |
| 6,510,191 | B2 | 1/2003 | Bockelman |
| 6,580,301 | B2 | 6/2003 | Moshe |
| 6,590,434 | B2 | 7/2003 | Chung |
| 6,720,811 | B2 | 4/2004 | Yazawa |
| 6,930,525 | B2 | 8/2005 | Lin |
| 7,332,950 | B2 | 2/2008 | Blodgett |
| 2008/0122471 | A1 | 5/2008 | Yamanaka |

FOREIGN PATENT DOCUMENTS

CN    1433148 A    7/2003

*Primary Examiner*—An T Luu
(74) *Attorney, Agent, or Firm*—Winston Hsu; Scott Margo; Min-Lee Teng

(57) ABSTRACT

A delay circuit comprising a delay measurement unit, a delay mapping unit and a map delay module. The delay measurement unit generates a mapping table according to a reference signal and a reference clock signal. The delay mapping unit generates a mapped delay selection signal according to an input selection signal and at least a mapping value from the mapping table. The map delay module delays an input data signal to generate an output data signal according to the mapped delay selection signal.

20 Claims, 10 Drawing Sheets

DELAY CIRCUIT AND RELATED METHOD THEREOF

CROSS REFERENCE TO RELATED APPLICATIONS

This application is a continuation application of a co-pending U.S. patent application Ser. No. 11/763,454, filed 2007, Jun. 15, and included herein by reference.

BACKGROUND OF THE INVENTION

The present invention relates to a delay circuit and related method thereof, and particularly relates to a delay circuit utilizing a mapping table to select proper number of delay stages, and related method thereof.

FIG. 1 illustrates a circuit diagram of a related art delay circuit 100. The delay circuit 100 includes a plurality of delay stages 101, 103, 105 (only part of the delay stages are illustrated) to 10n, and utilizes a selection signal SS to select a number of the delay stages to delay the input data signal Datain by a desired delay amount in order to generate a desired output data signal Dataout. However, many factors such as temperature, process, the lines between the elements of the delay circuit 100 or the delay amount generated by the elements themselves will affect the delay circuit 100, such that the selected delay stages may provide an undesired delay amount.

One example of the above-mentioned defects is that the delay circuit will be non-monotonic. Such disadvantages are especially apparent for a high resolution delay circuit. In this situation, chose more delay stages but may provide a less delay amounts, therefore a serious mismatching problem will occur.

SUMMARY OF THE INVENTION

One embodiment of the present application discloses a delay circuit comprising a delay measurement unit, a delay mapping unit and a map delay module. The delay measurement unit generates a mapping table according to a reference signal and a reference clock signal. The delay mapping unit generates a mapped delay selection signal according to an input selection signal and at least a mapping value from the mapping table. The map delay module delays an input data signal to generate an output data signal according to the mapped delay selection signal.

Another embodiment of the present application discloses a signal delay method, which comprises: providing a mapping table; generating a mapped delay selection signal according to an input selection signal and at least a mapping value from the mapping table; and delaying an input data signal to generate an output data signal according to a mapped delay selection signal.

According to the above-mentioned circuit and method, a desired delay amount can be obtained. Also, a monotonic delay circuit can be obtained accordingly. Preferably, the steps of generating the mapping table and selecting a desired number of delay stages can be performed by the same circuit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 illustrates a circuit diagram of the detailed structure of the delay mapping unit shown in FIG. 2a.

FIG. 6 is a block diagram illustrating detailed structures of the delay measurement unit 201 shown in FIG. 2a.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
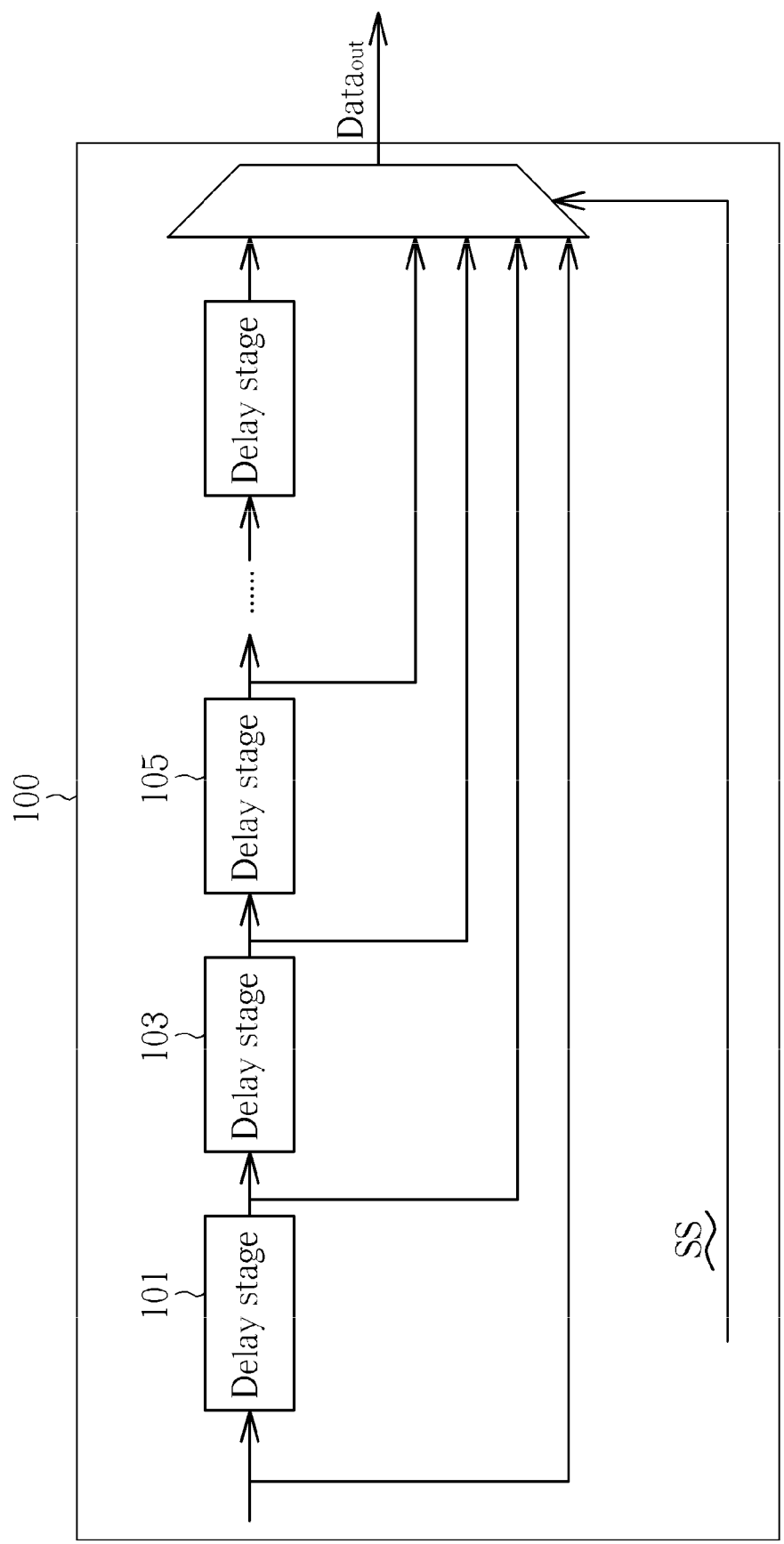
FIG. 1 illustrates a circuit diagram of a related art delay circuit.
Figure 2A:
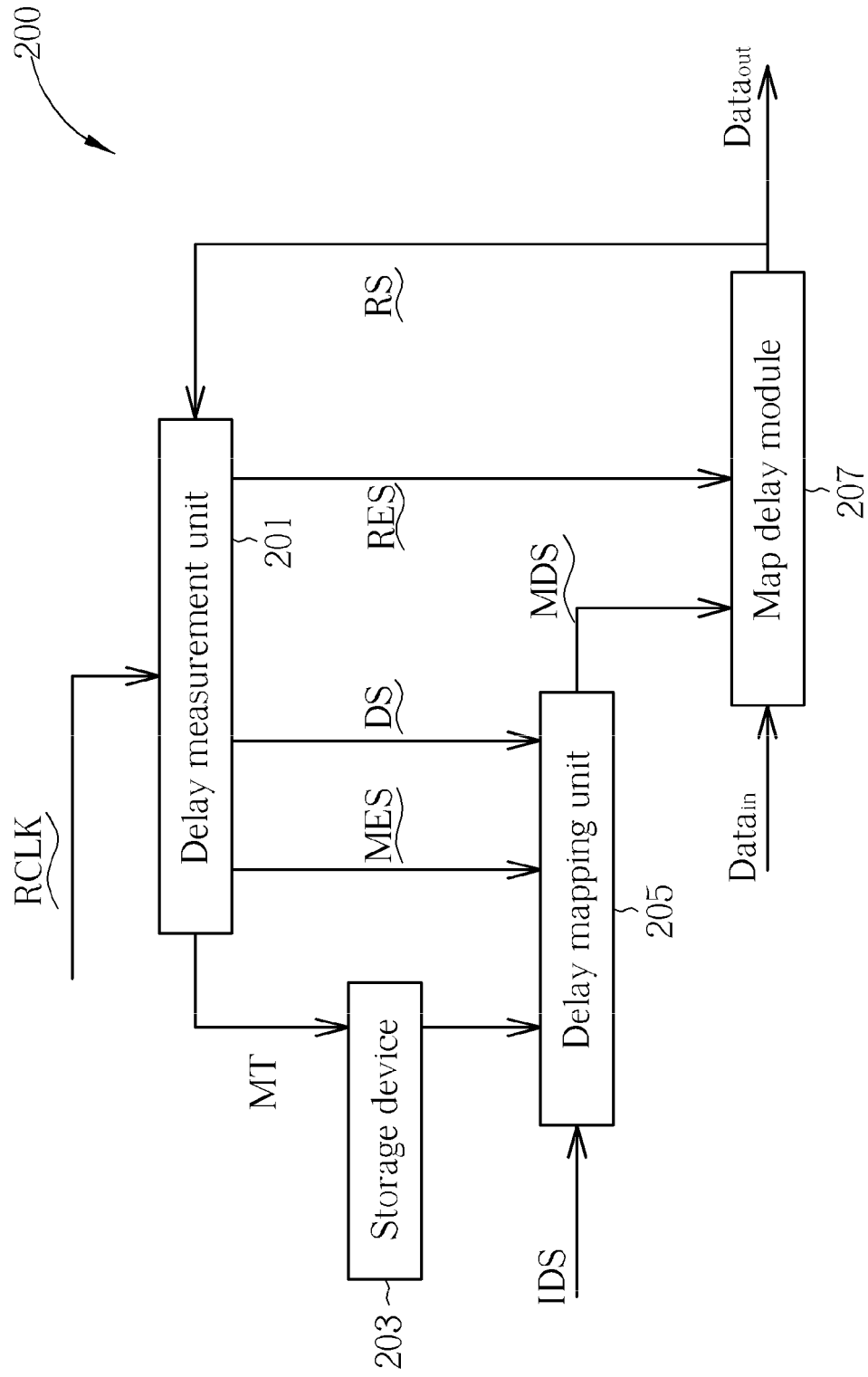
FIG. 2a illustrates a block diagram of a delay circuit according to an embodiment of the present invention.

FIG. 2a illustrates a block diagram of a delay circuit 200 according to an embodiment of the present invention that used to generate a mapping table and select a proper number of delay stages according to the mapping table. The delay circuit 200 comprises: a delay measurement unit 201, a storage device 203, a delay mapping unit 205, and a map delay module 207. The delay measurement unit 201 is utilized for generating a mapping table MT, a map enable signal MES, a ring enable signal RES, and a delay selection signal DS according to a reference signal RS and a reference clock signal RCLK. The storage device 203 (for example, a register or a memory), which is coupled to the delay measurement unit 201, is used for storing the mapping table MT from the delay measurement unit 201. The delay mapping unit 205, which is coupled to the storage device 203 and the delay measurement unit 201, is controlled by the map enable signal MES for generating a mapped selection signal MDS according to the delay selection signal DS in a first mode (mapping table generating mode) and according to an input selection signal IDS and a mapping value of the mapping table in a second mode (normal mode). The map delay module 207, which is coupled to the delay measurement unit 201 and the delay mapping unit 205, is controlled by the ring enable signal RES for generating the reference signal RS corresponding to the mapped selection signal MDS in the first mode and for delaying an input data signal $Data_{in}$ to generate an output data signal $Data_{out}$ corresponding to the mapped selection signal MDS in the second mode.

Briefly, the operation of the delay circuit 200 can be summarized as a method comprising two steps: The first step generates a mapping table according to a reference signal RS from a delay circuit in a first mode. The second step maps an input selection signal IDS to select a proper number of delay stages of the map delay module 207 according to a mapping value of the mapping table MT in the second mode.

Figure 2B:
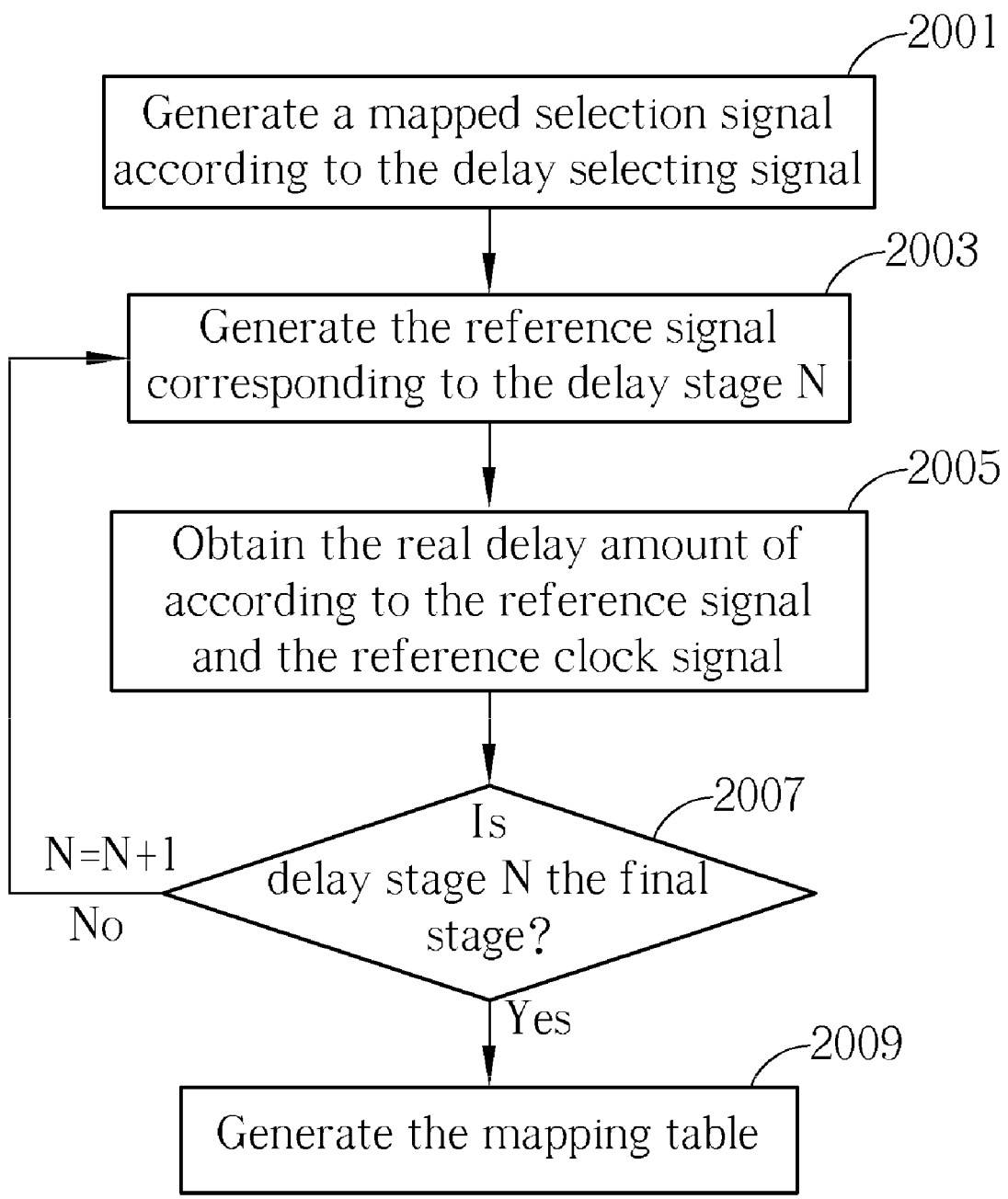
FIG. 2b is a flow chart illustrating the operations of the delay circuit 200 in the first mode.

FIG. 2b is a flow chart illustrating the operations of the delay circuit 200 in the first mode (mapping table generating mode). The steps comprise:

Step 2001

The map enable signal MES controls the delay mapping unit 205 to generate a mapped selection signal MDS according to the delay selecting signal DS. In other mode, the input delay selection signal IDS is transformed to the mapped selection signal MDS according to a mapping table MT stored in the storage device 203. Therefore the number of stages selected by the mapped selection signal MDS and the input delay selection signal IDS may be different in other mode. However, in this mode, the number of delay stages selected by the mapped selection signal MDS equals to the number of the delay selection signal DS.

Step 2003

The ring enable signal RES controls the map delay module 207 to generate the reference signal RS corresponding to the delay stage N selected by the mapped selection signal MDS.

The reference signal RS, which is a periodical signal in this embodiment, can indicate the real delay amount of each delay stage of the map delay module 207. The detail structure of the map delay module 207 and how the reference signal RS is generated will be described as below.

Step 2005

Obtain the real delay amount of the delay stage selected by the delay stage N selected by the mapped selection signal MDS according to the reference signal RS and the reference clock signal RCLK.

Step 2007

Determine if the delay stage N selected by the mapped selection signal MDS is a final delay stage of the delay circuit. If yes, go to step 2009, if not, N=N+1, and return to step 2003.

Step 2009

The delay mapping unit 201 generates the mapping table MT according to the real delay amounts of all delay stages.

In one embodiment, the mapping table MT is generated according to which number of the delay stages has real delay amount having minimum difference from the delay amount of the original selected delay stage. For example, if the input delay selection signal IDS selects 3 delay stages having a delay amount of 1 us, and the real delay amount of 3 delay stages is 0.6 us, the real delay amount of 5 delay stages is 1.1 us. Then the mapping table will map 3 delay stages to 5 delay stages, that is, mapped selection signal MDS will select 5 delay stages instead of 3 stages. It should be noted that, such mechanism is only for example and does not mean to limit the scope of the present invention. Other mechanism based on this concept should also fall in the scope of the present invention. Also, the mapping table MT is generated according to all delay stages of the delay circuit in one embodiment, but the mapping table can be generated according to only part of the delay stages.

The mapping table MT not only can be generated to indicate the real delay amount of the map delay module 207, but also can be generated to meet different requirements. For example, a delay circuit in the map delay module 207 can be a monotonic delay chain according to the mapping table. Also, the mapping table can make the delay stages of the delay circuit in the map delay module 207 have a minimum delay amount difference with each other. The detail description of theses examples will be shown in the following.

In the first mode, the control signal MES controls the delay mapping unit 205 to enable the delay selection signal DS to be sent for selecting the number of delay stages of the map delay module 207, such that the map delay module 207 can generate a reference signal RS (a periodical signal in this embodiment, but this is not a limitation of the present invention) corresponding to the selected number of delay stages. The reference signal RS can indicate the real delay of the selected number of delay stages. Then the delay measurement unit 201 generates a mapping table MT according to the reference signal RS.

Figure 2C:
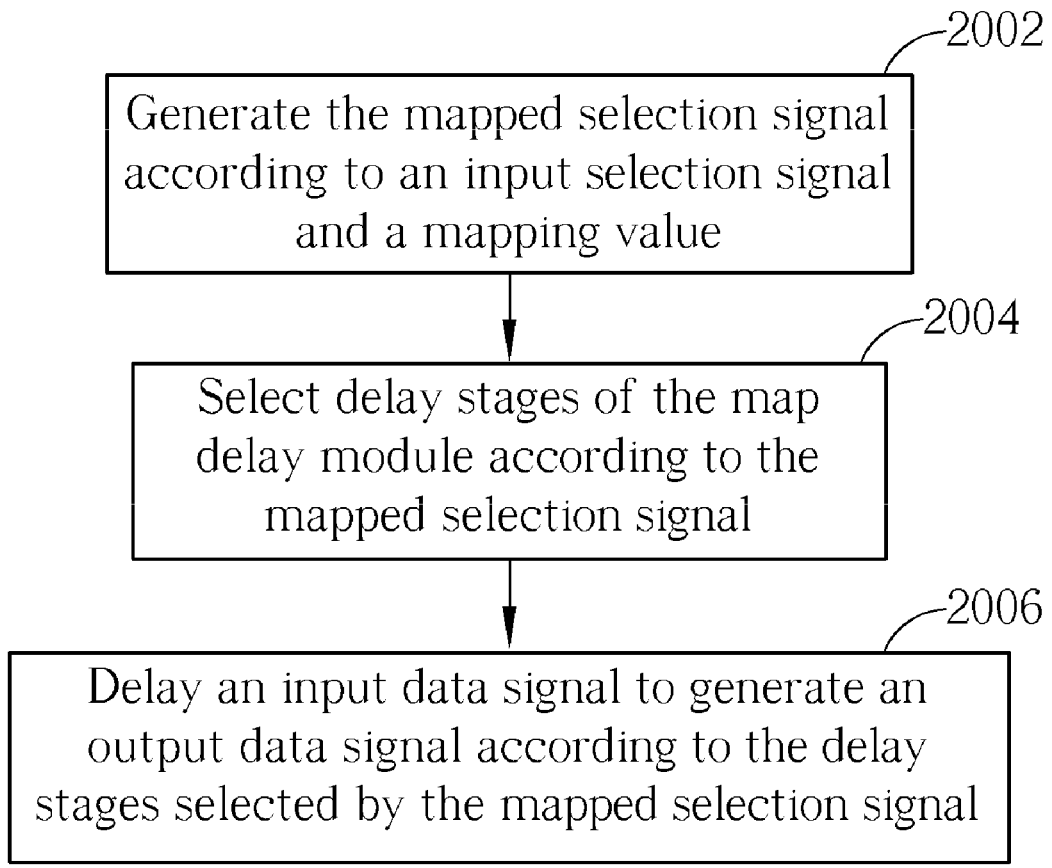
FIG. 2c is a flow chart illustrating the operations of the delay circuit 200 in the second mode.

FIG. 2c is a flow chart illustrating the operations of the delay circuit 200 in the second mode (normal mode). The steps comprise:

Step 2002:

The map enable signal MES controls the delay mapping unit 205 to generate the mapped selection signal MDS according to an input selection signal IDS and a mapping value from the mapping table MT stored in the storage device 203. In this mode, the mapped selection signal MDS is according to the input delay selection signal IDS instead of the delay selection signal DS, and the number of stages selected by the mapped selection signal MDS and the input delay selection signal IDS may be different.

Step 2004

Select delay stages of the map delay module 207 according to the mapped selection signal MDS.

Step 2006:

The ring enable signal RES controls the map delay module 207 to delay an input data signal $Data_{in}$ to generate an output data signal $Data_{out}$ according to the delay stages selected by the mapped selection signal MDS, instead of generating the reference signal RS.

In the second mode, the delay mapping unit 205 maps the input selection signal IDS to a mapped selection signal MDS according to a mapping value of the mapping table MT to select a proper number of delay stages, such that a desired delay amount or a desired delay circuit type can be provided. For example, if the number of the original delay stages selected by the input selection signal IDS is 2, and the mapped delay stage number corresponding to the original delay stage number selected by the mapped selection signal MDS is 3, then the mapping value is 3.

It should be noted that the present invention is not limited to have all the devices disclosed in FIG. 2a. The person skilled in the art can just implement the delay measurement unit 201 and the map delay module 207 to generate a mapping table. Additionally, the above-mentioned mapping table is not limited to be obtained by the above-mentioned circuit. If at least one specific mapping value is predetermined or a mapping table is obtained by other circuits or programs, the delay mapping unit 205 can be used to map the input data signal IDS to a mapped selection signal MDS to select a proper number of delay stages according to the mapping value.

Figure 3:
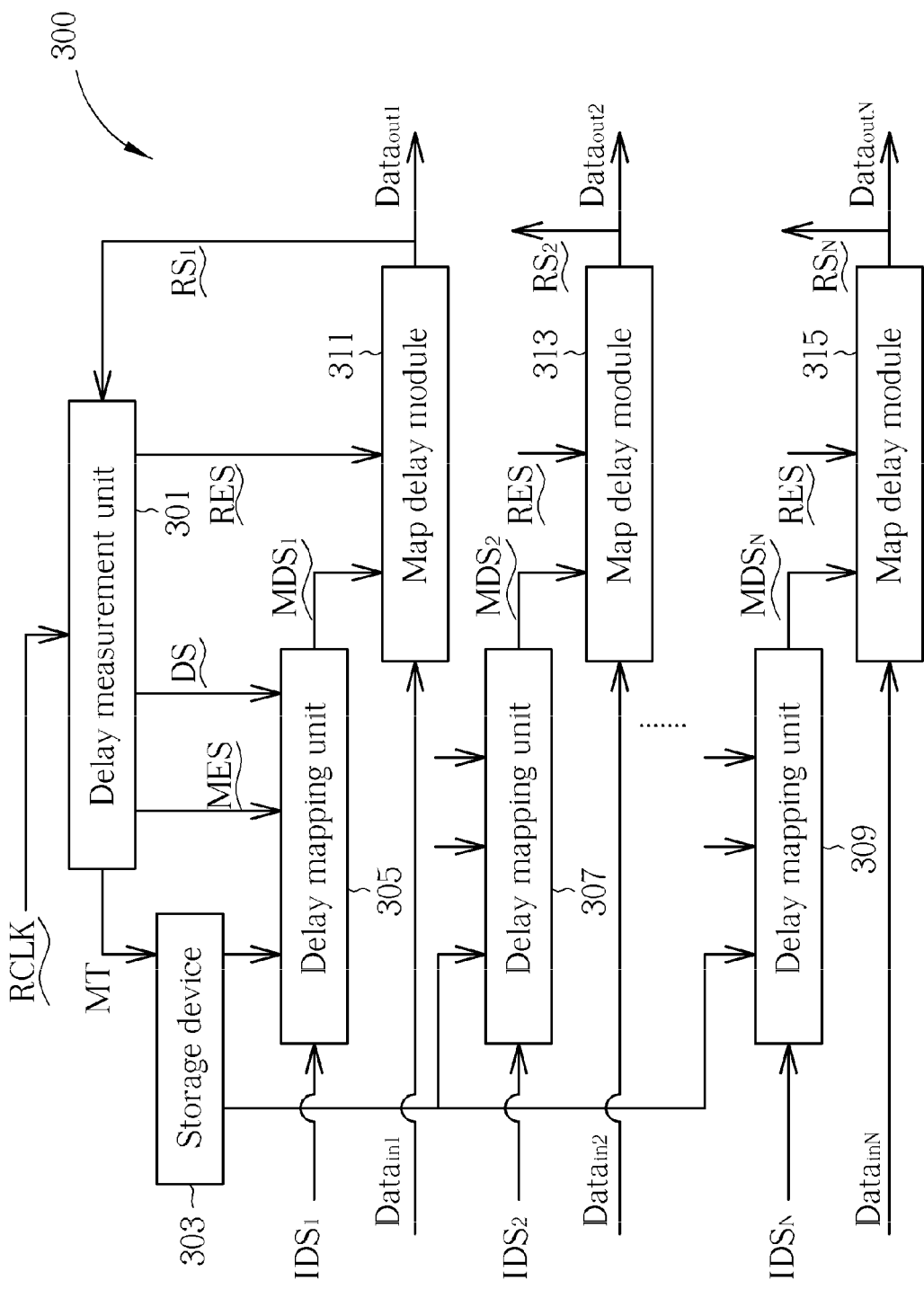
FIG. 3 illustrates a block diagram of a delay circuit comprising more than one delay mapping unit and map delay module according to a second embodiment of the present invention.

Furthermore, the delay circuit 200 is not limited to be applied to a single delay mapping unit. FIG. 3 illustrates a block diagram of a delay circuit 300 comprising more than one delay mapping unit and map delay module according to a second embodiment of the present invention. As shown in FIG. 3, the delay circuit 300 includes more than one delay mapping unit 305, 307, 309 and more than one map delay module 311, 313, 315. The delay mapping units 305, 307, 309 are jointly coupled to the delay measurement unit 301 and the storage device 303 for respectively mapping the input data signal $IDS_1$~$IDS_n$ to the mapping delay selection signals $MDS_1$~$MDS_N$ according to the mapping table stored in the storage device 303. The map delay module 311, 313, 315 are used for delaying input data signals $Data_{in1}$~$Data_{inN}$ according to the mapped selection signals $MDS_1$~$MDS_N$ to respectively generate output data signals $Data_{out1}$~$Data_{outN}$. If map delay modules 311, 313, 315 have the same characteristics, they can use the same mapping table. Furthermore, if map delay modules 311, 313, 315 have different characteristics, they can respectively generate reference signals $RS_1$~$RS_N$ to generate different mapping tables, and the delay mapping units 305, 307, 309 can map the input data signal $IDS_1$~$IDS_n$ to the mapping delay selection signals $MDS_1$~$MDS_N$ according to different mapping tables.

Figure 4:
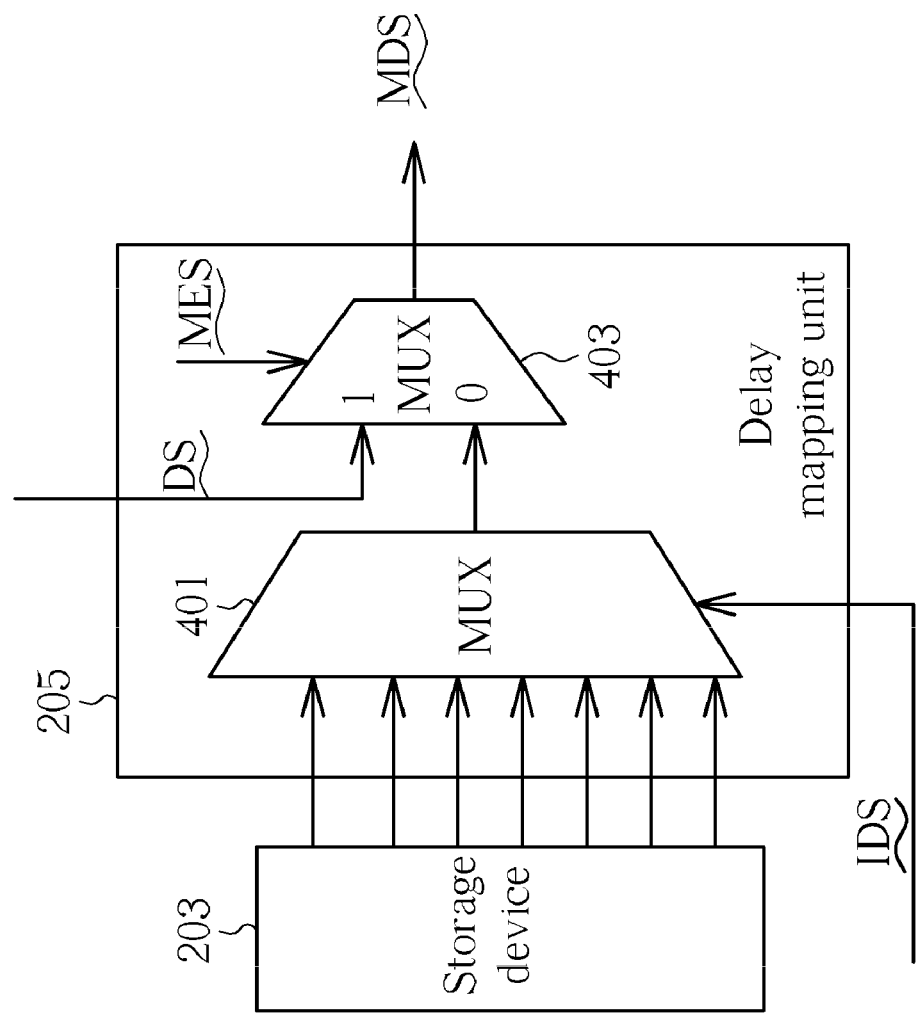

FIG. 4 illustrates a circuit diagram of the detailed structure of the delay mapping unit 205 shown in FIG. 2a. The delay mapping unit 405 includes a first multiplexer 401 and a second multiplexer 403. The first multiplexer 401, which is coupled to the storage device 203, is used for outputting the mapping value from the mapping table stored in the storage device 203 according to the input selection signal IDS. The second multiplexer 403, which is coupled to the first multiplexer 403 and is controlled by the map enable signal MES, is used for outputting the delay selection signal DS as the mapped selection signal MDS in the first mode and for outputting the mapping values as the mapped selection signal MDS in the second mode.

Figure 5:
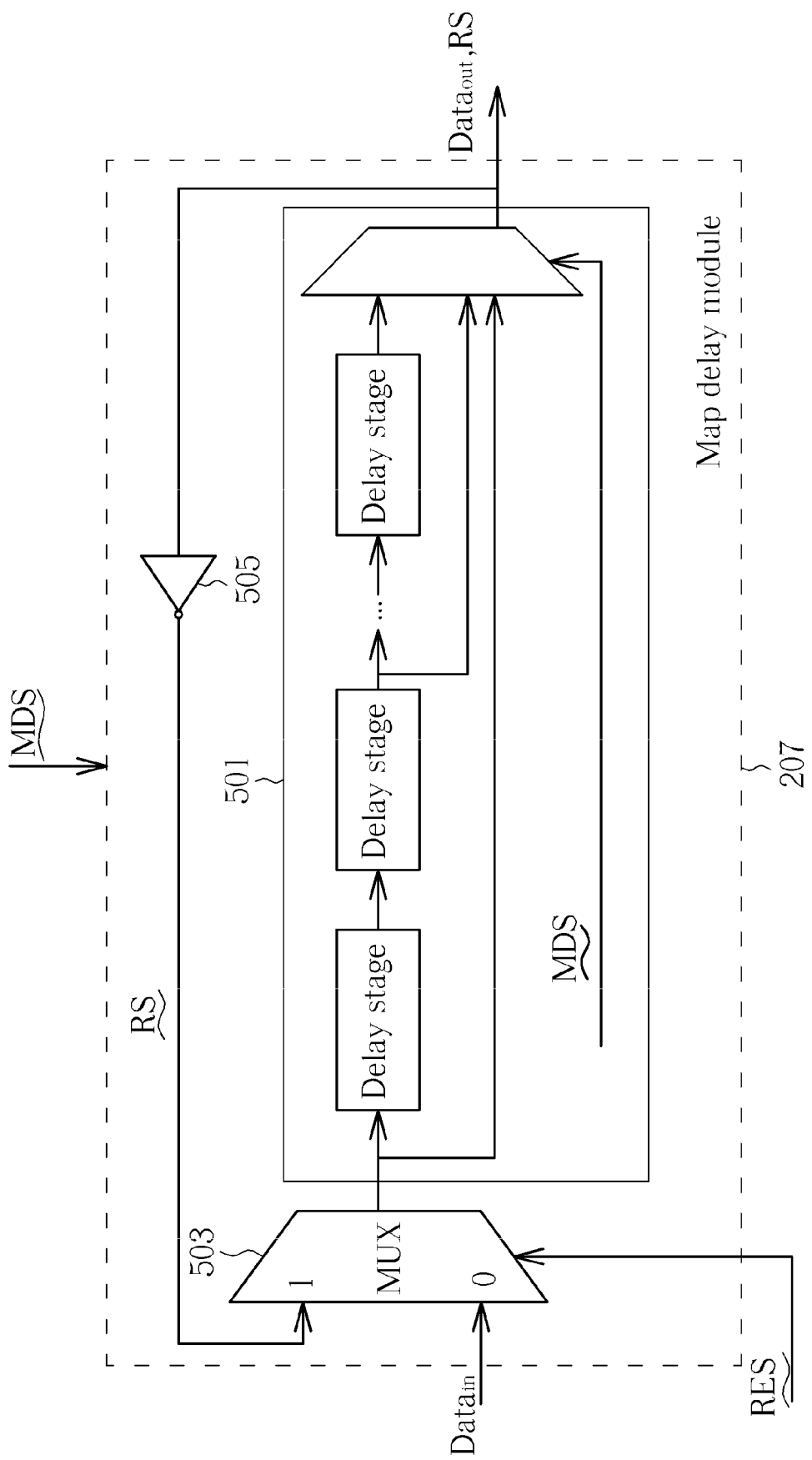
FIG. 5 illustrates a circuit diagram of the map delay module shown in FIG. 2.

FIG. 5 illustrates a circuit diagram of the map delay module shown in FIG. 2. The map delay module 207 comprises a delay chain 501 and a multiplexer 503, in this embodiment, the reference signal RS is a periodical signal. The multiplexer 503 is used for outputting the reference signal RS in the first mode and outputting the input data signal $Data_{in}$ in the second mode. The delay chain 501, which includes a plurality of delay stages, is used for generating the reference signal RS in the first mode and for generating the output data signal $Data_{out}$ according to the input data signal from the multiplexer 503 and mapped selection signal MDS in the second mode. A proper number of delay stages is selected by the mapped selection signal MDS, and the output data signal $Data_{out}$ and the reference signal RS outputted from the delay chain 501 correspond to the selected delay stages. In this case, if the mapped delay selection MDS signal selects d delay stages, the period of the reference signal RS is 2 (ti+td), 2ti is the period of the reference signal RS corresponding to no delay stage, and td is the delay corresponding to the selected d delay stages.

It should be noted that, although the map delay module 207 further includes an inverter 505 to match the structure of the delay chain 501 for generating the reference signal RS, the inverter 505 can be omitted if the structure of the delay circuit is different.

Figure 6:
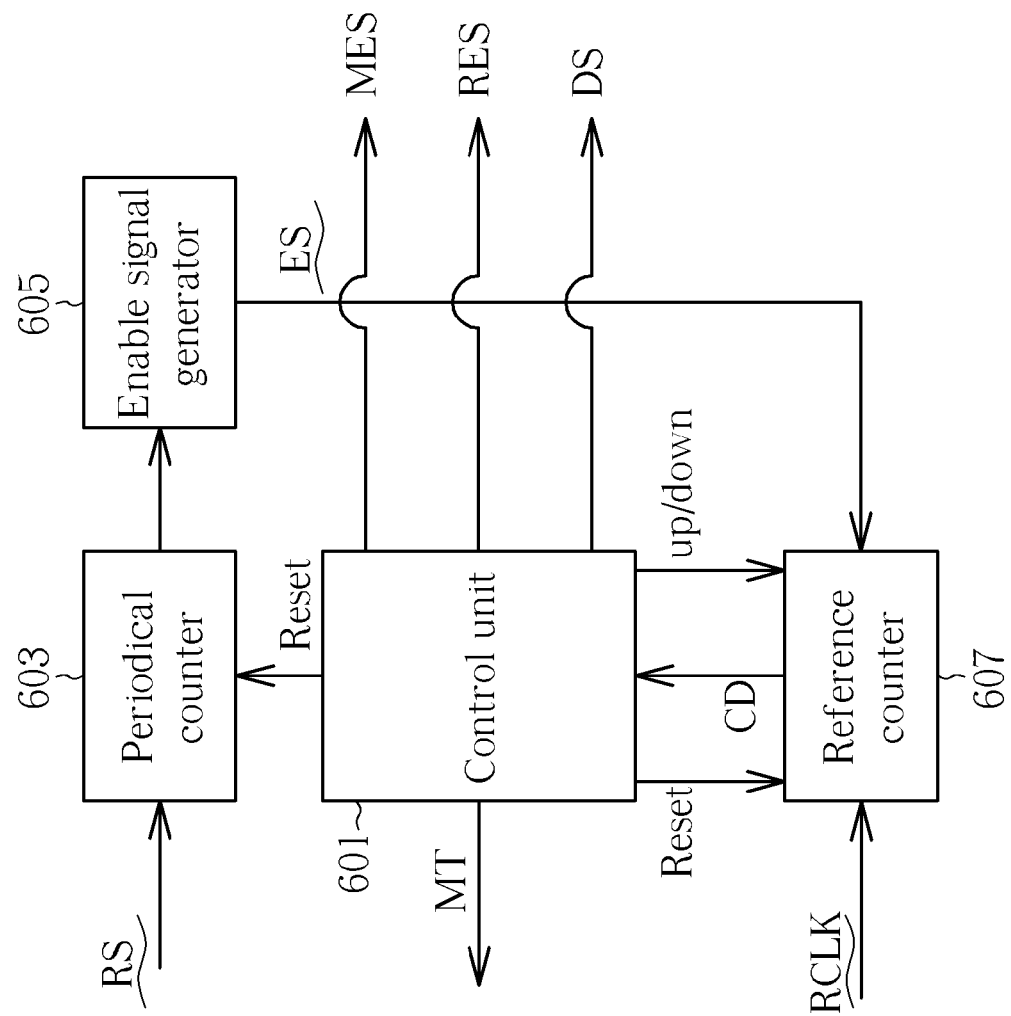

FIG. 6 is a block diagram illustrating detailed structures of the delay measurement unit 201 shown in FIG. 2a. The delay measurement unit 201 comprises a control unit 601, a periodical counter 603, an enable signal generator 605 and a reference counter 607. The periodical counter 603 is used for counting the periodical signal (the reference signal RS) to generate a periodical counter value. The enable signal generator 605, which is coupled to the periodical counter 603, is used for generating an enable signal ES according to the periodical counter value. The reference counter 607, which is controlled by the enable signal ES, is used for counting the reference clock signal RCLK to generate a counter difference value CD between two periodical signals corresponding to two different mapped delay selecting signals MDS. The control unit 601, which is coupled to the periodical counter 603 and the reference counter 607, is for controlling the periodical counter 603 and the reference counter 607 to generate the mapping table MT according to the counter difference value CD, and for generating the map enable signal MES, the ring enable signal RES and the delay selection signal DS.

The periodical counter is reset to a negative value near 0, and the reference counter is set to 0. Then, a selected number of delay stages is selected by the delay selection signal DS, and the mapped delay circuit 207 outputs the periodical signal (the reference signal RS) corresponding to the selected delay stages to the periodical counter 603, such that the periodical counter 603 will count up. The enable signal generator controls the enable signal ES to be 1 for enabling the reference counter 607 to count up when the periodical counter value reaches 0. The enable signal ES is set to 0 to stop the reference counter 607 and the control signal RES is set to 0 when the periodical counter 603 reaches a specific value. After a period of time, the control unit 601 resets the periodical counter 603 to a negative value near 0, sets the delay selection signal DS as 0 (that is, makes the mapped delay circuit provide a periodical signal with no delay amount), and sets the ring enable signal RES to 1. Then the same operation as described above is performed, but this time the reference counter 607 counts down.

In this way, the counter difference value CD between the periodical signal corresponding to the selected number of delay stages and the periodical signal corresponding to no delay stage is obtained. If the period of the reference clock signal is tr, the ideal CD is 2td/tr. By repeating the above-mentioned operation, all counter difference values CD between the periodical signals corresponding to all the delay stages and the periodical signal corresponding to no delay stage can be obtained. After that, the control unit 601 can generate a mapping table MT according to the counter difference values DC. It should be noted that, although the counter difference values DC indicate the relations between the delay stages in this embodiment, the delay amount of the delay stages can also be obtained according to the counter difference values DC if the delay amount of delay stages is known.

It should be noted that the devices and the operation shown in FIG. 6 are only given as examples and are not meant to limit the scope of the present invention. For example, the control unit 601 may only receive the reference counter values corresponding to delay stages from the reference counter 607 and transmit them to other devices for calculating the mapping table MT according to the reference counter values. The devices for calculating the mapping table MT can be a microprocessor, which can be located outside the delay measurement unit 201 or be integrated to the delay measurement unit 201. All such variations also fall within the scope of the present invention.

As part or all of the counter difference values CD are obtained, a mapping table MT can be determined according to desired results. Table 1 is an example of a table illustrating the relation between ideal CDs and actual CDs.

TABLE 1

|  | Number of Delay Stages | | | | |
| --- | --- | --- | --- | --- | --- |
|  | 0 | 1 | 2 | 3 | 4 |
| Actual CD | 0 | 17 | 52 | 43 | 80 |
| Ideal CD | 0 | 20 | 40 | 60 | 80 |

The order of ideal CDs makes the delay circuit a monotonic delay circuit, but the order of actual CDs does not. Therefore, if the delay circuit is desired to be a monotonic delay circuit, a mapping table shown in Table 2 will be obtained. Although the input selection signal IDS selects 2 delay stages, the mapping value is 3. Similarly, although the input selection signal IDS selects 3 delay stages, the mapping value is 2. In this way, each number of the selected delay stages will have a delay amount having a minimum error from the ideal delay amount. Also, the delay circuit after mapping is a monotonic delay circuit in the embodiment shown in Table 2.

TABLE 2

|  | IDS | | | | |
|---|---|---|---|---|---|
|  | 0 | 1 | 2 | 3 | 4 |
| Mapping Value | 0 | 1 | 3 | 2 | 4 |

Additionally, if the design of the circuit cannot allow all the counter difference values CD to be recorded, each number of selected delay stages is desired to have a delay amount having a minimum error from the ideal delay amount. Other kinds of mapping table different from the mapping table shown in Table 2 can be generated. For example, only delay stages with a larger actual CD than ideal CD can be selected as the delay stage for mapping. Table 3 illustrates such a kind of mapping table, which references the relation shown in Table 1. In this case, although the error between the ideal CD and the actual CD is 32, the delay circuit will still be a monotonic delay circuit, and the space for recording the counter difference values can be decreased.

TABLE 3

|  | IDS | | | | |
|---|---|---|---|---|---|
|  | 0 | 1 | 2 | 3 | 4 |
| Mapping Value | 0 | 2 | 2 | 4 | 4 |

If the delay chain is a high resolution delay chain, the storage device can only contain a simplified mapping table instead of a mapping table corresponding to all delay stages to save the storage space. Table 4 illustrates relations between ideal CDs and actual CDs for a high resolution delay chain. The delay chain includes 16 delay stages, but the number of the ideal CDs is only 4. Therefore, the actual CD of 1 delay stage is compared with the first ideal CD 20, the actual CD of 2 delay stages is compared with the first ideal CD 40 etc. A mapping table can then be generated accordingly.

TABLE 4

| | d | | | | | | | | | | | | | | | | |
|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 |
| Actual CD | 0 | 4 | 12 | 15 | 17 | 21 | 28 | 37 | 34 | 43 | 52 | 61 | 59 | 63 | 68 | 75 | 80 |
| Ideal CD | 0 | | | | 20 | | | | 40 | | | | 60 | | | | 80 |

Table 5 is a mapping table example for a high resolution delay chain corresponding to Table 4. In this case, an original delay stage is mapped to a closest delay stage having an actual CD larger than the ideal counter difference of the original delay stage. The delay circuit is a monotonic delay circuit according to the mapping table shown in Table 5. In this case, the input selection signal IDS is multiplied by a predetermined parameter n (4 in this embodiment) to generate the mapped selection signal MDS for selecting mapped delay stages.

TABLE 5

|  | IDS | | | | |
|---|---|---|---|---|---|
|  | 0 | 1 | 2 | 3 | 4 |
| Mapping Value | 0 | 5 | 9 | 11 | 16 |

Such mapped delay circuit will have larger errors for delay amount, however. Therefore, in order to decrease the difference between the original delay stages and mapped delay stages, the delay chain 1200 can comprise a main delay chain 1201 for providing a main delay amount according to the input selection signal IDS, and an offset delay chain to provide an offset delay amount according to an offset selection signal for amending the difference between the actual delay amount and the ideal delay amount, as shown in FIG. 7.

Figure 8:
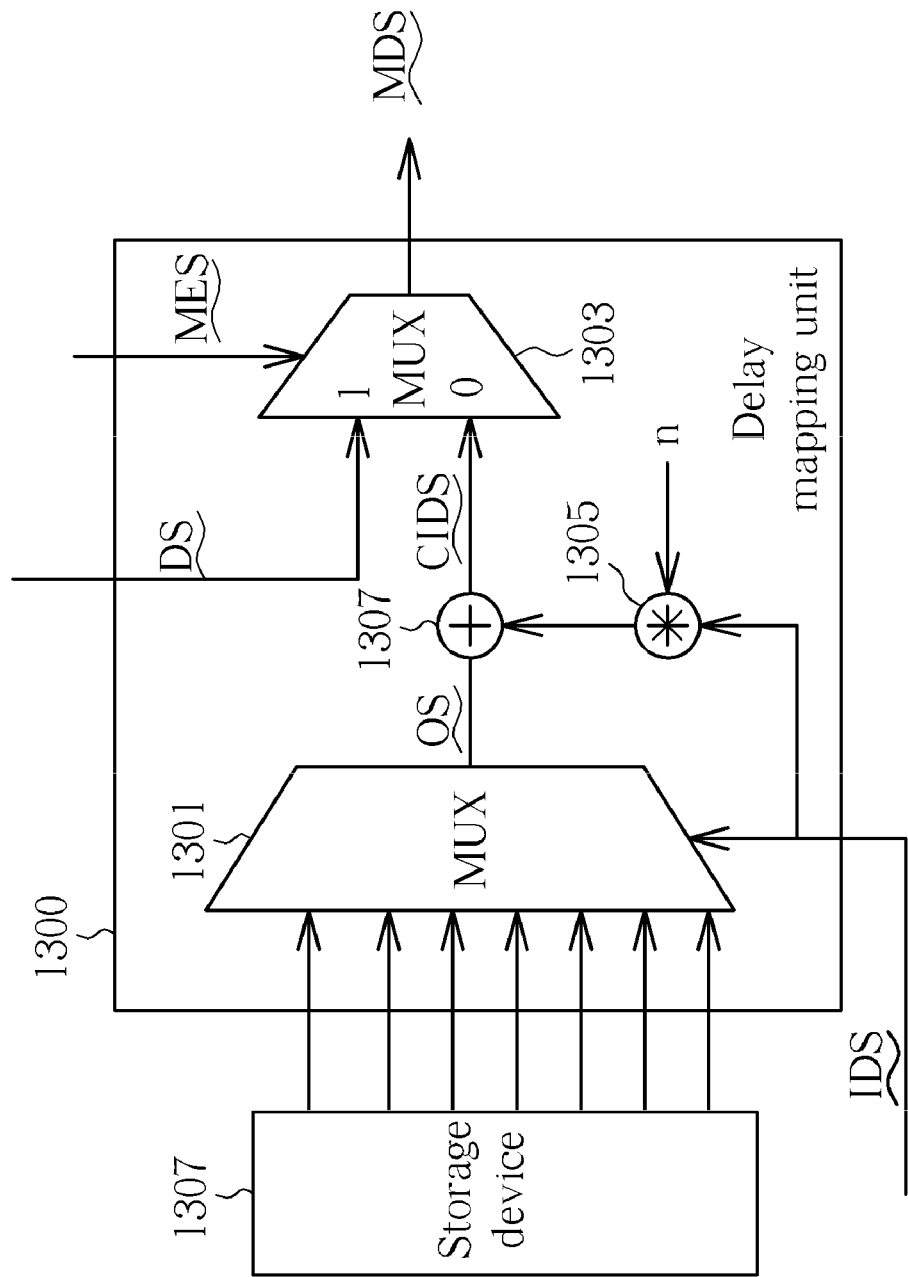
FIG. 8 is a circuit diagram illustrating a delay mapping unit according to one embodiment of the present invention.

FIG. 8 is a delay mapping unit according to one embodiment of the present invention. As shown in FIG. 8, the delay mapping unit comprises: multiplexers 1301, 1303, a multiplier 1305, and an adder 1307. The multiplexer 1301, which is coupled to the storage device 1307, is used for outputting the mapping value from the mapping table and the offset selection signal OS from an offset table stored in the storage device 1307 according to the input selection signal IDS. The multiplexer 1303 is coupled to the adder 1307, for outputting the delay selection signal DS as the mapped selection signal MDS in the first mode and for outputting a combined input selection signal CIDS as the mapped delay selection in the second mode.

The multiplier 1305, which is coupled to the adder 1307, is used for generating the multiplied input selection signal MIDS. The adder 1307 is used for combining the multiplied input selection signal MIDS and the offset delay selection signal OS to generate the combined input selection signal CIDS.

Figure 7:
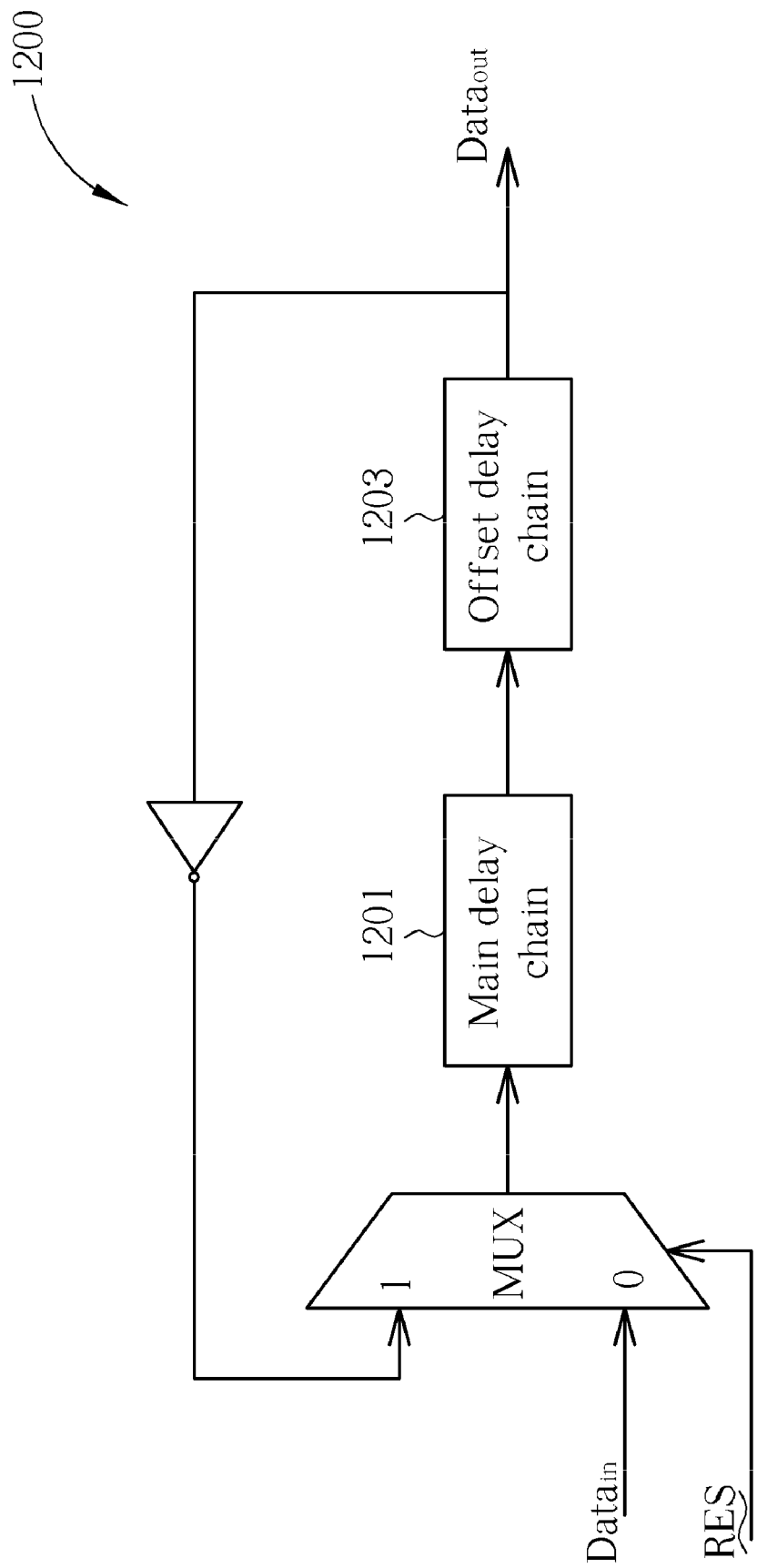
FIG. 7 is a circuit diagram illustrating a delay circuit comprising a main delay chain and an offset delay chain.

Moreover, the delay circuit 1200 shown in FIG. 7 is not limited to be utilized for the high resolution circuit described in Table 4 and Table 5. The main delay chain 1201 can be directly selected by a main delay selection signal, which is equal to the input selection signal IDS, without multiplying the input selection signal IDS by a predetermined parameter n. The offset delay chain 1203 is selected by an offset delay selection signal, which is selected from the offset table stored in the storage device according to the input selection signal IDS. In this way, not only can a monotonic delay circuit be obtained, but the difference between actual and ideal delay amount can also be decreased.

The methods corresponding to the above mentioned circuits can be obtained according to the above-mentioned description, and are therefore omitted for brevity.

According to the above-mentioned circuits and methods, not only can a desired delay amount be obtained by mapping, but a mapping table can also be generated according to the reference signal generated from the delay circuit to be mapped. Also, a monotonic delay circuit can be obtained accordingly. Preferably, the steps of generating the mapping table and selecting desired delay stages by mapping can be performed by the same circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay circuit, comprising:
   a delay measurement unit for generating a mapping table according to a reference signal and a reference clock signal;
   a delay mapping unit for generating a mapped delay selection signal according to an input selection signal and at least a mapping value from the mapping table; and
   a map delay module, coupled to the delay mapping unit, for delaying an input data signal to generate an output data signal according to the mapped delay selection signal.

2. The delay circuit of claim 1, further comprises a storage device coupled to the delay mapping unit, for storing the mapping table.

3. The delay circuit of claim 2, wherein the delay measurement unit generates the mapping table, a map enable signal, a ring enable signal, and a delay selection signal according to the reference signal from the map delay module and the reference clock signal; wherein the delay mapping unit is controlled by the map enable signal for generating the mapped selection signal according to the delay selection signal in a first mode and according to the input selection signal and the mapping table in a second mode; where the map delay module, is controlled by the ring enable signal for generating the reference signal corresponding to the mapped selection signal in the first mode and for delaying the input data signal to generate the output data signal corresponding to the mapped selection signal in the second mode.

4. The delay circuit of claim 3, wherein the delay mapping unit comprises:
   a first multiplexer, coupled to the storage device, for outputting the mapping value from the mapping table stored in the storage device according to the input selection signal;
   a second multiplexer, coupled to the first multiplexer, for outputting the delay selection signal as the mapped selection signal in the first mode and the mapping value as the mapped selection signal in the second mode.

5. The delay circuit of claim 3, wherein the reference signal is a periodical signal and the map delay module comprises:
   a multiplexer, for outputting the periodical signal in the first mode and the input data signal in the second mode; and
   a delay chain, including a plurality of delay stages, for generating the periodical signal in the first mode and for generating the output data signal according to the input data signal from the multiplexer in the second mode, wherein at least one of the delay stages is selected by the mapped selection signal, where the output data signal and the periodical signal outputted from the delay chain correspond to the selected delay stages.

6. The delay circuit of claim 3, wherein the reference signal is a periodical signal and the delay measurement unit comprises:
   a periodical counter, for counting the periodical signal to generate a periodical counter value;
   an enable signal generator, coupled to the periodical counter, for generating an enable signal according to the periodical counter value;
   a reference counter, controlled by the enable signal, for counting the reference clock signal to generate a counter difference value between two periodical signals corresponding to two different mapped delay selecting signals; and
   a control unit, coupled to the periodical counter and the reference counter, for controlling the periodical counter and the reference counter to generate the mapping table according to the counter difference value, and for generating the map enable signal, the ring enable signal and the delay selection signal.

7. The delay circuit of claim 3, wherein the reference signal is a periodical signal and the delay measurement unit comprises:
   a periodical counter, for counting the periodical signal to generate a periodical counter value;
   an enable signal generator, coupled to the periodical counter, for generating an enable signal according to the periodical counter value;
   a reference counter, controlled by the enable signal, for counting the reference clock signal to generate reference counter values corresponding to different mapped delay selecting signals;
   a control unit, coupled to the periodical counter and the reference counter, for controlling the periodical counter and the reference counter and receiving the reference counter value; and
   a micro processor, coupled to the reference counter, for generating the mapping table according to the reference counter values from the control unit.

8. The delay circuit of claim 3, wherein the delay chain includes a plurality of delay stages and the mapping table only corresponds to part of the delay stages.

9. The delay circuit of claim 8, wherein the storage device further stores an offset table, the map delay module includes a main delay chain for providing a main delay amount and an offset delay chain for providing an offset delay amount, and the input data signal is delayed for a main delay amount and an offset delay amount to generate the output data signal, where the input selection signal is multiplied for a predetermined parameter to generate a multiplied input selection signal for selecting at least one of the delay stage of the main delay chain according to the mapping table to provide the main delay amount, where the offset delay amount is selected by an offset selection signal from the offset table, and the offset selection signal corresponds to the delay stages selected by the multiplied input selection signal.

10. The delay circuit of claim 9, wherein the delay mapping unit comprises:
    a first multiplexer, coupled to the storage device, for outputting the mapping value from the mapping table and the offset selection signal from the offset table stored in the storage device according to the input selection signal;
    a second multiplexer, coupled to the first multiplexer, for outputting the delay selection signal as the mapped selection signal in the first mode and for outputting a combined input selection signal as the mapped delay selection in the second mode;
    a multiplier, coupled to the first multiplexer and the second multiplexer, for generating the multiplied input selection signal; and
    an adder, for combining the multiplied input selection signal and the offset delay selection signal to generate the combined input selection signal.

11. The delay circuit of claim 3, wherein the storage device further stores an offset table, the input selection signal includes a main delay selection signal and a offset delay selection signal, the map delay module comprises:
- a multiplexer, for outputting the output data signal in the second mode and the reference signal in the first mode;
- a main delay chain, coupled to the multiplexer and including a plurality of delay stages, for providing a main delay amount to the input data signal, wherein at least one of the delay stage is selected by the main delay selection signal to provide the main delay amount; and
- an offset delay chain, coupled to the main delay chain, for providing an offset delay amount to the input data signal according to the offset delay selection signal;
- wherein the input data signal is delayed for the main delay amount and the offset delay amount to generate the output data signal.

12. The delay circuit of claim 11, wherein the offset delay selection signal is obtained from the offset table according to the main delay selection signal.

13. The delay circuit of claim 12, wherein the delay mapping unit comprises:
- a first multiplexer, coupled to the storage device, for selecting the offset delay selection signal from the offset table according to the main delay selection signal; and
- a second multiplexer, coupled to the first multiplexer, for outputting the delay selection signal as the mapped selection signal in the first mode and the main delay selection signal combining the offset delay selection signal as the mapped selection signal in the second mode.

14. A signal delay method, comprising:
providing a mapping table;
generating a mapped delay selection signal according to an input selection signal and at least a mapping value from the mapping table; and
delaying an input data signal to generate an output data signal according to the mapped delay selection signal.

15. The signal delay method of claim 14, comprising: (a) generating the mapping table according to a reference signal from a delay circuit in a first mode; and (b) mapping the input selection signal to select at least one delay stage of the delay circuit according to a mapping value of the mapping table in a second mode.

16. The signal delay method of claim 15, wherein the reference signal is a periodical signal and the step (a) comprises:
counting the periodical signal to generate a periodical counter value;
counting a reference clock signal to generate a counter difference value between two periodical signals corresponding to two different number of delay stages; and
generating the mapping table according to the counter difference value.

17. The signal delay method of claim 15, wherein the reference signal is a periodical signal and the step (a) comprises:
counting the periodical signal to generate a periodical counter value;
counting the reference clock signal to generate reference counter values corresponding to different mapped delay selecting signals; and
generating the mapping table according to the reference counter values.

18. The signal delay method of claim 15, further generating a second mapping table, wherein the step (b) further maps an input selection signal to select at least one delay stage of the delay circuit according to a mapping value of the second mapping table in the second mode.

19. The signal delay method of claim 15, further generating an offset table, the delay circuit includes a main delay chain for providing a main delay amount and an offset delay chain for providing an offset delay amount, and the input data signal is delayed for a main delay amount and an offset delay amount to generate the output data signal, where the input selection signal is multiplied for a predetermined parameter to generate a multiplied input selection signal for selecting at least one of the delay stage of the main delay chain according to the mapping table to provide the main delay amount, where the offset delay amount is selected by an offset selection signal from the offset table, and the offset selection signal corresponds to the delay stages selected by the multiplied input selection signal.

20. The signal delay method of claim 15, further generating an offset table, the input selection signal includes a main delay selection signal and a offset delay selection signal, the delay circuit includes a main delay chain for providing a main delay amount according to the main delay selection signal and an offset delay chain for providing an offset delay amount according to the offset delay selection signal, and the input data signal is delayed for a main delay amount and an offset delay amount to generate the output data signal.

* * * * *